United States Patent
Lu et al.

(10) Patent No.: US 9,773,739 B2
(45) Date of Patent: Sep. 26, 2017

(54) MARK STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Dao Liang Lu, Shanghai (CN); Hong Wei Zhang, Shanghai (CN); Kui Feng, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/397,788

(22) Filed: Jan. 4, 2017

(65) Prior Publication Data
US 2017/0221833 A1    Aug. 3, 2017

(30) Foreign Application Priority Data

Feb. 3, 2016   (CN) .......................... 2016 1 0079408

(51) Int. Cl.
*H01L 23/544*   (2006.01)
*H01L 23/528*   (2006.01)
(Continued)

(52) U.S. Cl.
CPC ...... *H01L 23/544* (2013.01); *H01L 21/31116* (2013.01); *H01L 21/31144* (2013.01);
(Continued)

(58) Field of Classification Search
CPC ............. H01L 23/544; H01L 21/76877; H01L 21/76802; H01L 2223/54426; H01L 21/31144; H01L 2223/54493
See application file for complete search history.

(56) References Cited

U.S. PATENT DOCUMENTS 6,083,807 A * 7/2000 Hsu ..................... G03F 7/70633
                                                        257/797
9,401,332 B2 * 7/2016 Noda .................... H01L 23/544
(Continued)

FOREIGN PATENT DOCUMENTS

EP    1477860 A1   11/2004

OTHER PUBLICATIONS

The European Patent Office (EPO) The Extended European Search Report for 17152668.4 dated Jun. 2, 2017 7 Pages.

*Primary Examiner* — Jasmine Clark
(74) *Attorney, Agent, or Firm* — Anova Law Group, PLLC

(57) ABSTRACT

The present disclosure provides mark structures and fabrication methods thereof. An exemplary fabrication process includes providing a substrate having a device region, a first mark region and a second mark region; sequentially forming a device layer, a dielectric layer and a mask layer on a surface of the substrate; forming a first opening in the dielectric layer in the device region, a first mark in the dielectric layer in the first mark region, and a mark opening in dielectric layer in the second mark region, bottoms of the first opening, the first mark and the mark opening being lower than a surface of the dielectric layer, and higher than a surface of the device layer; and forming a second opening in the dielectric layer on the bottom of the first opening and a second mark in the dielectric layer on the bottom of the mark opening.

8 Claims, 7 Drawing Sheets

(51) Int. Cl.
*H01L 21/768* (2006.01)
*H01L 21/311* (2006.01)

(52) U.S. Cl.
CPC .. *H01L 21/76802* (2013.01); *H01L 21/76877* (2013.01); *H01L 23/528* (2013.01); *H01L 2223/5446* (2013.01)

(56) References Cited

U.S. PATENT DOCUMENTS

| | | |
|---|---|---|
| 2002/0098707 A1 | 7/2002 | Ning |
| 2005/0272221 A1* | 12/2005 | Yen .................... H01L 23/544 438/401 |
| 2012/0146195 A1 | 6/2012 | Lee |
| 2015/0187703 A1* | 7/2015 | Zhou .................... H01L 23/544 257/797 |

* cited by examiner

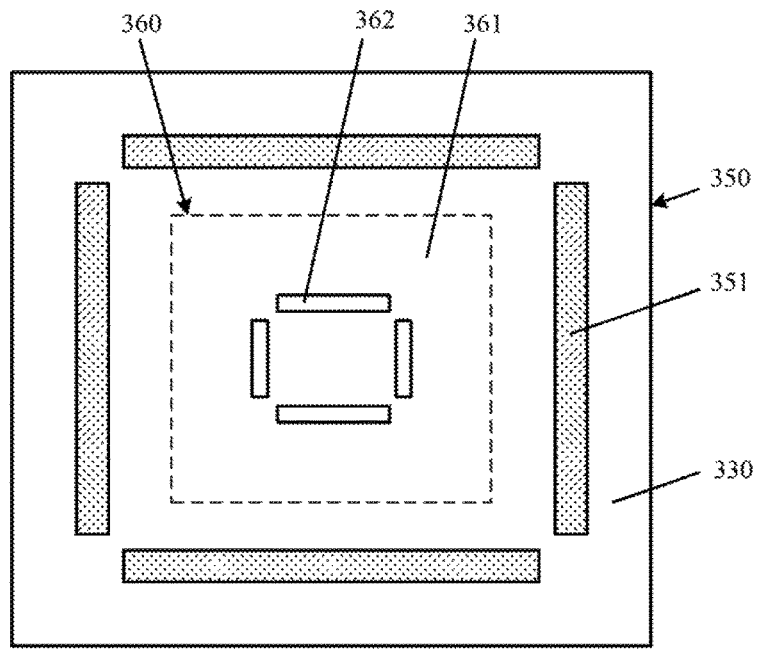

FIG. 14

| | S101 |
|---|---|
| Providing a substrate; forming a device layer on the substrate; forming a dielectric layer on the device layer; and forming a mask layer on the dielectric layer | |

| | S102 |
|---|---|
| Forming a first mark, a first mark opening and a first opening in the dielectric layer | |

| | S103 |
|---|---|
| Forming a second mark in the dielectric layer and a second opening the dielectric layer on the bottom of the first opening | |

| | S104 |
|---|---|
| Forming a conductive structure in the first opening and the second opening | |

FIG. 15

MARK STRUCTURE AND FABRICATION METHOD THEREOF

CROSS-REFERENCES TO RELATED APPLICATIONS

This application claims the priority of Chinese patent application No. 201610079408.1, filed on Feb. 3, 2016, the entirety of which is incorporated herein by reference.

FIELD OF THE INVENTION

The present invention generally relates to the field of semiconductor manufacturing technology and, more particularly, relates to mark structures and fabrication processes thereof.

BACKGROUND

During a semiconductor fabrication process, before forming semiconductor devices on a wafer, a layout design of the wafer is necessary to divide the wafer into a plurality of dies and a plurality of scribe lanes among adjacent dies. The dies are used to subsequently form the semiconductor devices; and the scribe lanes are used as cutting lines when the dies are packaged after forming the semiconductor devices.

Dividing the surface of the wafer into the dies and scribe lanes is often achieved by transferring patterns on a mask of a photolithography process to the surface of the wafer. Specifically, the process for dividing the surface of the wafer into the dies and the scribe lanes includes forming a photoresist layer on the surface of the wafer by a spin-coating process; installing the wafer having the photoresist layer into an exposure apparatus after baking the photoresist layer; exposing the baked photoresist to transfer the patterns on the mask to the photoresist layer by an exposure process; post-baking the exposed photoresist layer; and developing the post-baked photoresist layer to form the patterns in the photoresist layer. In the design of the mask for dividing the surface of the wafer into the dies and the scribe lanes, it is common to form the required patterns of the photolithography process, such as alignment marks and overlay marks, etc., in the scribe lanes.

For the existing techniques, the photoresist often has offset, rotation, shrinking and extending, and/or orthogonal change, etc., during the overlay exposure process because of the overlay precision, wafer shift and focusing precision, etc. Thus, an overlay measuring mark is required for measuring the exposure error between different dies formed in a same photoresist layer, and/or the exposure error between the dies at a same position of different photoresist layers. By doing so, the overlay precision of the wafer is obtained.

However, for the overlay marks formed at a same position of different photoresist layers, there is a resolution difference. Such a resolution difference affects the detection of the overlay precision. Thus, the overlay marks may be unable to meet the requirement of the continuous development of the manufacturing. The disclosed device structures and methods are directed to solve one or more problems set forth above and other problems in the art.

BRIEF SUMMARY OF THE DISCLOSURE

One aspect of the present disclosure includes a method for fabricating a mark structure. The method includes providing a substrate having a device region and a mark region including a first mark region and a second mark region surrounded by the first mark region; sequentially forming a device layer, a dielectric layer and a mask layer over a surface of the substrate; forming a first opening in the dielectric layer in the device region, a first mark in the dielectric layer in the first mark region, and a mark opening in the dielectric layer in the second mark region, a bottom of the first opening, a bottom of the first mark and a bottom of the mark opening being lower than a surface of the dielectric layer and higher than a surface of the device layer; forming a second opening exposing the device layer in the dielectric layer on the bottom of the first opening and a second mark in the dielectric layer on the bottom of the mark opening; and forming a conductive structure in the first opening and the second opening.

Another aspect of the present disclosure includes a mark structure. The mask structure includes a substrate having a device region and a mark region including a first mark region and a second mark region surrounded by the first mark region; a device layer formed on a surface of the substrate; a dielectric layer formed on a surface of the device layer; a plurality of first mark trenches formed in the dielectric layer in the first mark region; a plurality of second mark trenches formed in the dielectric layer in the second mark region; and a conductive structure electrically connected with the device layer formed in in the dielectric layer in the device region.

Another aspect of the present disclosure includes a mark structure. The mark structure includes a substrate having a device region and a mark region including a first mark region and a second mark region surrounded by the first mark region; a device layer formed on a surface of the substrate; a dielectric layer formed on a surface of the device layer; a plurality of first mark protruding structures formed in the dielectric layer in the first mark region; a plurality of second mark trenches formed in the dielectric layer in the second mark region; and a conductive structure electrically connected with the device layer formed in the dielectric layer in the device region.

Other aspects of the present disclosure can be understood by those skilled in the art in light of the description, the claims, and the drawings of the present disclosure.

BRIEF DESCRIPTION OF THE DRAWINGS

FIGS. 10-14 illustrate structures corresponding to certain stages of another exemplary fabrication process of a mark structure consistent with the disclosed embodiments; and FIG. 15 illustrates an exemplary fabrication process of a mark structure consistent with the disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
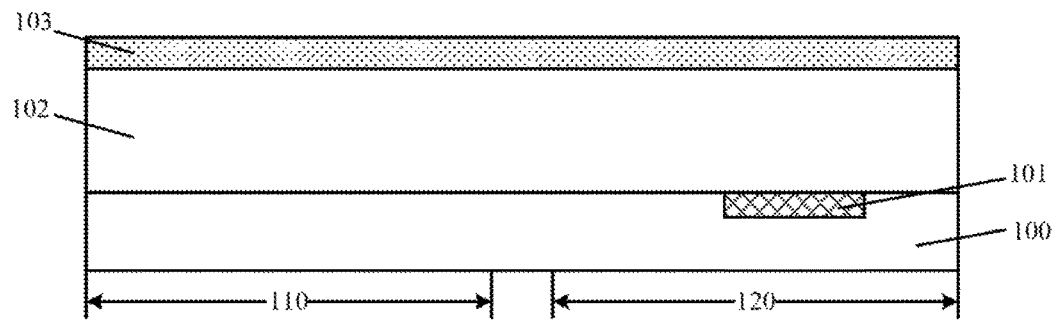
FIGS. 1-4 illustrate structures corresponding to certain stages of an existing fabrication process of an overlay mark.

FIGS. 1-4 illustrate structures corresponding to certain stages of an existing fabrication process of an overlay mark structure. As shown in FIG. 1, the fabrication process includes providing a substrate 100. The substrate 100 includes a mark region 110 and a device region 120. A device layer 101 is formed on the surface of the substrate 100 in the device region 120; and a dielectric layer 102 is formed on the surface of the device layer 101 and the surface of the substrate 100. Further, a mask layer 103 is formed on the surface of the dielectric layer 102.

Figure 2:
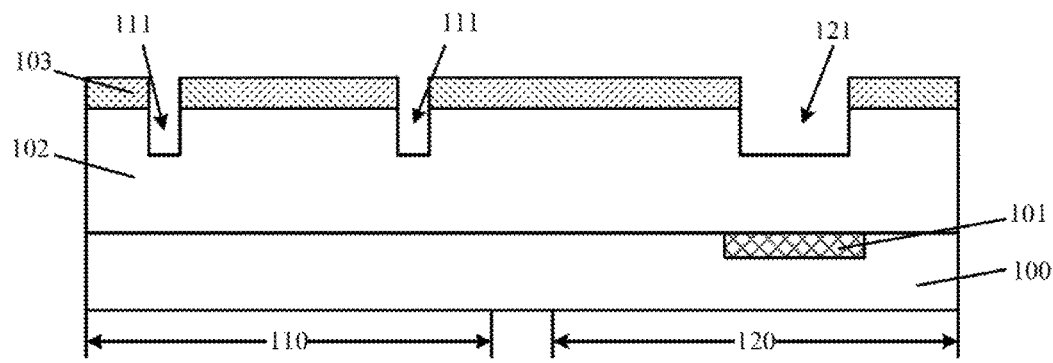

Further, as shown in FIG. 2, a first opening 121 is formed in the device region 120 and a plurality of first mark trenches 111 are formed in the mark region 110 by etching the mask layer 103 and the dielectric layer 102. The number of the first mark trenches 111 is four; and the four first mark trenches 111 form a quadrangle.

Figure 3:
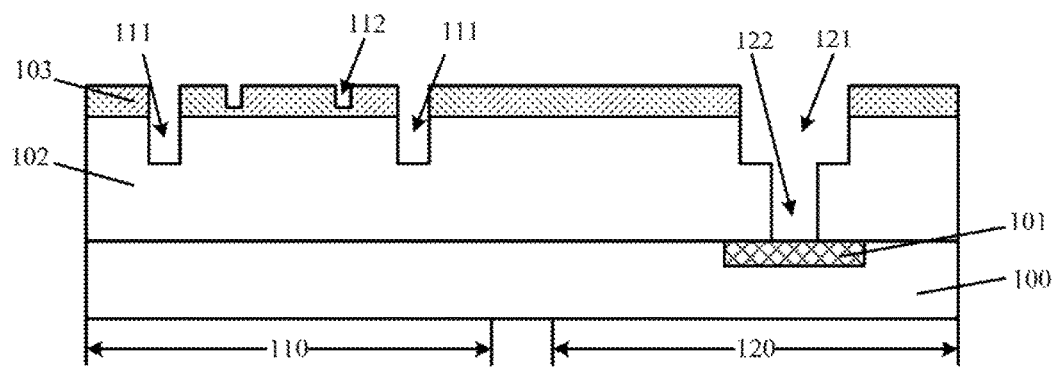
Figure 4:
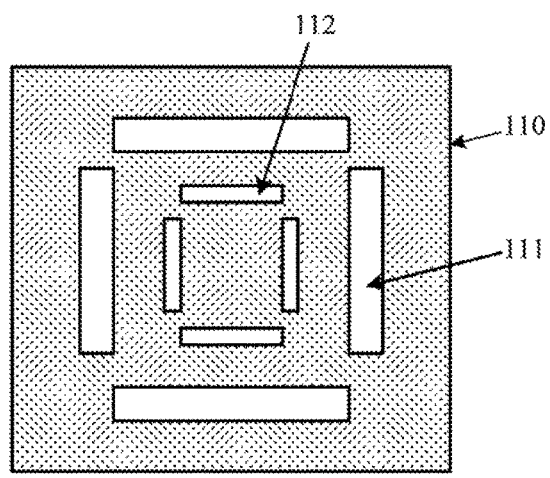

Further, as shown in FIGS. 3-4 (FIG. 4 is a top view of the structure illustrated in FIG. 3). A plurality of the second mark trenches 112 are formed in the region enclosed by the plurality of first mark trenches 111; and a second opening 122 is formed on the bottom of the first opening 121. The second opening 122 exposes the device layer 101. The plurality of second mark trenches 122 and the second opening 122 are formed by etching the mask layer 103 in the mark region 110 and the bottom of the first opening 121 using a second etching process.

The first mark trenches 111 and the second mark trenches 112 form an overlay mark structure. The first mark trenches 111 are used to define the position of the first opening 121; and the second mark trenches 112 are used to define the position of the second opening 122. By measuring the relative positions between the first mark trenches 111 and the second mark trenches 112, the offset between the first opening 121 and the second opening 122 is obtained. The fabrication process can be improved according to the obtained offset.

The first opening 121 and the second opening 122 are used to form a conductive structure used to electrically connect with the conductive layer 101; and the process for forming the conductive structure is applicable to form structures with a relatively small feature size. Because the second opening 122 needs to expose the surface of the device layer 101 to achieve an electrical connection between the conductive structure and the device layer 101, the first opening 101 needs to be aligned with the device layer 101; and the second opening 122 also needs to be aligned with the conductive layer 101.

However, after the first etching process or the second etching process, it is easy to induce a stress-releasing between the mask layer 103 and the dielectric layer 102, and/or between the dielectric layer 102 and the device layer 101. Thus, an offset between the position of the first opening 121 and the position of the first trenches 111 is generated. Accordingly, the position of the subsequently formed second opening 122 relative to the first opening 121 and/or the device layer 121 is not accurate.

Further, because the first opening 121 is formed firstly; and the bottom of the first opening 121 does not expose the device layer 101, the position of the second opening 122 needs to be determined by the first opening 121. Once the first opening 121 has an offset relative to the device layer 101, the second opening 122 would have a larger offset relative to the device layer 101 if the second opening 122 has an offset relative to the first opening 121. Such a larger offset easily causes the bottom of the second opening 142 not to be able to precisely expose the device layer 101. Thus, during the fabrication of the conductive layer, it is not allowable to have gradual offsets among the device layer 101, the second opening 122 and the first opening 121 along one direction.

To ensure the position of the second opening 122 relative to the first opening 121 and the device layer 101 to be more accurate during the fabrication of the conducive structure, the fabrication process needs to be adjusted according to the overlay precision. Specifically, the fabrication process is improved by accurately measuring the offset of the relative position between the first opening 121 and the second opening 122; and by learning the offset situation of the relative position between the first opening 121 and the second opening 122. Thus, the detection of the overlay precision between the first opening 121 and the second opening 122 has higher requirements.

The first etching process is used to etch the mask layer 103 and a portion of the dielectric layer 102 to form the first opening 121. Thus, the first etching process has a relatively large etching rate to both the mask layer 103 and the dielectric layer 102. Accordingly, the depth of the first mark trenches 111 is relatively large; and the bottom of the first mark trenches 111 is lower than the surface of the dielectric layer 102. However, because the second etching process is used to etch the dielectric layer 102 on the bottom of the first opening 121, the second etching process has a larger etching rate to the dielectric layer 102 than to the mask layer 103. Such an etching rate difference causes the depth of the second mark trenches 112 formed on the mark region 110 is relatively small; or even is unable to penetrate through mask layer 103 to expose the dielectric layer 102. Thus, the patterns of the second mark trenches 112 are blurry. Especially after subsequently removing the mask layer 103 by a chemical mechanical polishing process, the second mark trenches 112 are completely removed; and the overlay precision between the first mark trenches 111 and the second mark trenches 112 may not be measured. Thus, the fabrication process of the devices is affected.

The present disclosure provides an improved fabrication process of a mark structure. FIG. 15 illustrates an exemplary fabrication process of a mark structure consistent with the disclosed embodiments; and FIGS. 5-9 illustrate structures corresponding to certain stages of the exemplary fabrication process.

Figure 5:
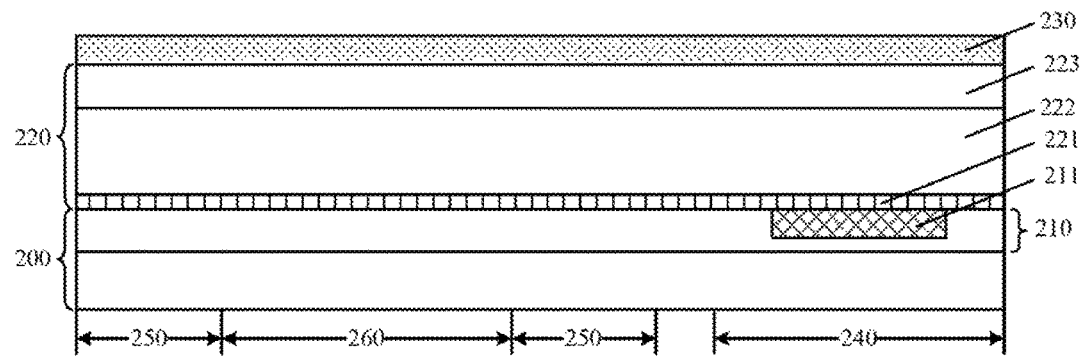
FIGS. 5-9 illustrate structures corresponding to certain stages of an exemplary fabrication process of a mark structure consistent with the disclosed embodiments.

As shown in FIG. 15, at the beginning of the fabrication process, a substrate with certain structures is provided (S101). FIG. 5 illustrates a corresponding structure.

As shown in FIG. 5, a substrate 200 is provided. The substrate 200 may include a mark region (not labeled) and a device region 240. The mark region may include a first mark region 250 and a second mark region 260. The first mark region 250 may surround the second mark region 260.

Further, a device layer 210 may be formed on the surface of the substrate 200. A dielectric layer 220 may be firmed on the surface of the device layer 210. A mask layer 230 may be formed on the surface of the dielectric layer 220.

The device layer 210 may have a conductive layer 211 formed in its surface in the device region 240. The dielectric layer 220 may include a barrier layer 221 formed on the surface of the device layer 210; a first dielectric layer 222 formed on the surface of the barrier layer 221; and a second dielectric layer 223 formed on the surface of the second dielectric layer 222.

The mark region may be used to form an overlay mark structure. The overlay mark structure may be used to detect the relative offset between the subsequently formed first opening and second opening. The device region 240 may be used to form semiconductor devices; and the semiconductor devices may form chip circuits, etc.

Further, the substrate 200 may also include dies (not shown) and scribe lanes (not shown) among adjacent dies distributed as an array. The dies may be used to form individual chips. The scribe lanes may be used to subsequently cut the substrate 200. By cutting through the scribe lanes, the plurality of dies may be independent to each other; and the individual chips may be formed.

Further, the device region 240 may be disposed in a die; and the mark region may be disposed in the scribe lane. After subsequently forming the overlay mark structure in the scribe lanes, when the scribe lanes are cut through, the overlay mark structure may be removed.

in one embodiment, the substrate 200 may include a base substrate (not shown), The device layer 210 may be formed on the surface of the base substrate. The conductive layer 211 may be exposed on the surface of the device layer 210.

The base substrate may be a Si substrate, a SiGe substrate, a SiC substrate, a silicon-on-insulator (SOI) substrate, a germanium-on-insulator (GOI) substrate, a glass substrate, or a III-V compound substrate (such as GaN, or GaAs), etc.

The device layer 210 may include device structures on the surface of the base substrate. The device structures may include one or more of gate structures of the transistors, fuse structures, resistors, capacitors, and inductors, etc.

The device layer 210 may also include an insulation layer (not shown). The insulation layer may be formed on the surface of the base substrate; and may cover the device structures. The insulation layer may be made of one or more of silicon oxide, silicon nitride, silicon oxynitride, low-K dielectric material, and ultra-low-K material, etc.

Further, the device layer 210 may also include electrical interconnect structures. The electrical interconnect structures may be formed on the surface of the base substrate and/or the surfaces of the device structures. The electrical interconnect structures may be used to electrically interconnect the device structures and/or electrically interconnect the device structures and the base substrate. The electrical interconnect structures may be made of metal or metal compound, such as one or more of Cu, W, Ti, Ni, TiN, and TaN, etc. The electrical interconnect structure may include conductive vias (or plugs) formed on the surface of the base substrate and/or the surfaces of the devices structures; and the conductive layer 211 formed on the top surface of the conductive vias. The conductive layer 211 may be used to electrically connect the conductive vias. The consecutive vias and the conductive layer 211 may be distributed in a single layer, or different layers.

In certain other embodiments, the substrate is the base substrate. A conductive layer may be formed in the substrate; and the conductive layer is exposed on the surface of the substrate. The conductive layer may be formed on the surface of an ion-doped region; and the conductive structure may be subsequently formed on the surface of the conductive layer to apply a bias voltage on the ion-doped region. Further, the conductive layer may also be able to connect with through silicon vias (TSV).

Referring to FIG. 5, the dielectric layer 220 may include a barrier layer 221, a first dielectric layer 222 and a second dielectric layer 223. The barrier layer 223 may be made of an N-containing material, etc. The first dielectric layer 222 may be made of an ultra-low-K dielectric material, etc. The dielectric constant of the ultra-low-K dielectric material may be smaller than approximately 2.5. The second dielectric layer 223 may be made of tetraethyl orthosilicate (TEOS), etc. The mask layer 230 may be made of TiN, etc.

The barrier layer 221 may be made of a material different from that of the first dielectric layer 222. Thus, the barrier layer 221 and the first dielectric layer 222 may have an etching selectivity. Accordingly, the barrier layer 221 may be used as an etching stop layer for a subsequent etching process.

Further, the first dielectric layer 222 may be made of an ultra-low-K material. The ultra-low-K material may be a porous material. Thus, the external contaminations and water vapor may be easy to penetrate through the first dielectric layer 222 to etch the interconnect structures. Therefore, it may need to form the barrier layer 221 on the surface of the device layer 210 before forming the first dielectric layer 222. The density of the barrier layer 221 may be greater than the density of the first dielectric material layer 222. Thus, the barrier layer 221 may be able to prevent the external contaminations and water vapor from directly contacting with the device layer 210.

The barrier layer 221 may be made of silicon nitride, or silicon oxynitride, etc. In one embodiment, the barrier layer 221 is made of silicon oxynitride. The thickness of the barrier layer 221 may he in a range of approximately 200 Å-500 Å. Various processes may be used to form the barrier layer 221, such as a chemical vapor deposition (CVD) process or an atomic layer deposition (ALD) process, etc.

The first dielectric layer 222 may be made of an ultra-low-K dielectric material. The process for forming the ultra-low-K dielectric material may include forming a seed layer on the surface of the barrier layer 221; and forming a bulk dielectric layer on the surface of the seed layer.

The seed layer may be made of SiCO, etc. The bulk dielectric layer may be made of porous SiCOH based on the seed layer made of SiCO.

The hardness and the density of the second dielectric layer 223 may be greater than those of the first dielectric layer 222. The second dielectric layer 223 may be used as an intermediate layer between the first dielectric layer 222 and the mask layer 230; and may be used to increase the adhesion strength between the mask layer 230 and the first dielectric layer 222. Further, the second dielectric layer 223 may keep a stable morphology during the subsequent planarization process for removing the mask layer 230; and may prevent the planarization process from excessively damaging the surface of the dielectric layer 220.

Various processes may be used to form the second dielectric layer 223. In one embodiment, a CVD process is used to form the second dielectric layer 223. The precursor of the CVD process may be TEOS, etc. A TEOS layer may be formed on the surface of the first dielectric layer 222. Then, the TEOS layer may be oxidized in an oxygen-containing environment; and silicon oxide may be formed.

The mask layer 230 may be used as a hard mask layer for subsequently etching the dielectric layer 220 in the device region 240 to form a first opening. In one embodiment, the mask layer 230 is made of TiN. In certain other embodiments, the mask layer 230 may be made of one or more of TaN, Ta, and Ti, etc. Various processes may be used to form the mask layer 230, such as a CVD process, an ALD process, or a physical vapor deposition (PVD) process, etc.

In one embodiment, before forming the mask layer 230, an interface layer may be formed on the surface of the dielectric layer 220. The interface layer may be made of silicon oxide. The interface layer may be used to increase the adhesion strength between the mask layer 230 and the dielectric layer 220.

Figure 6:
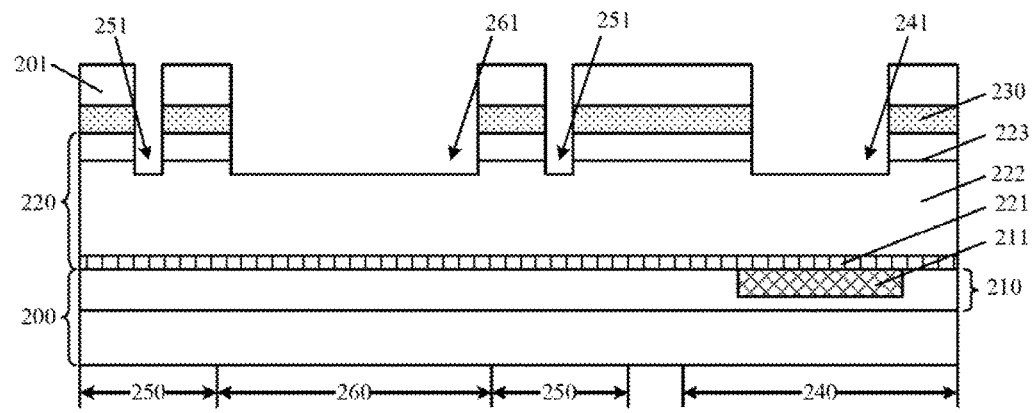
Figure 7:
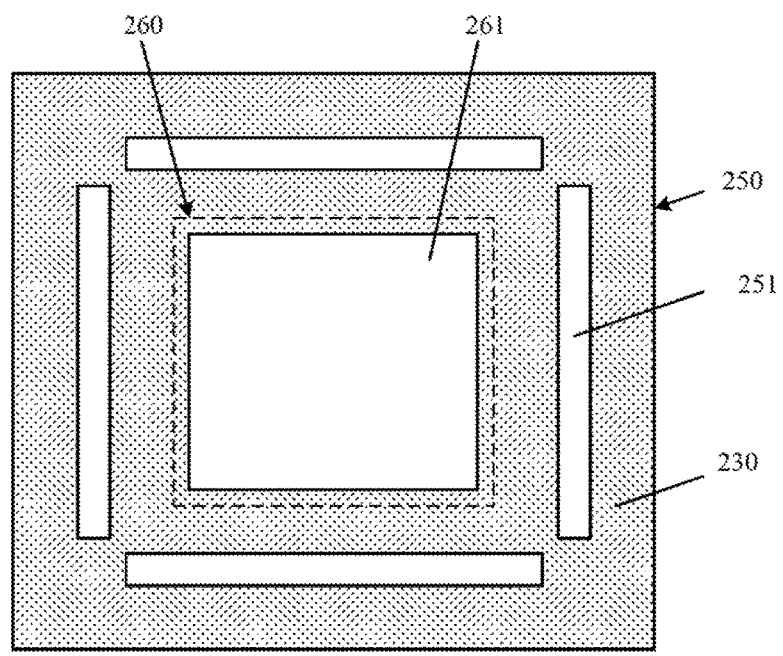

Returning to FIG. 15, after forming the mask layer 230, a first mark, a mark opening and a first opening may be formed (S102). FIGS. 6-7 illustrate a corresponding structure; and FIG. 7 is a top view of the mark region illustrated in FIG. 6.

As shown in FIGS. 6-7, a first mark (not labeled) is formed in the dielectric layer 220 in the first mark region 250; a mark opening 261 is formed in dielectric layer 220 in the second mark region 260; and a first opening 241 is formed in the dielectric layer 220 in the device region 240. The bottom of the first opening 214 and the bottom of the mark opening 261 may be higher than the surface of the device layer 240. The mark opening 261 may at least expose a portion of the dielectric layer 220 in the second mark region 260.

The first mark may include a plurality of the first mark trenches 251. The plurality of first mark trenches 215 may be evenly distributed around the second mark region 260.

In one embodiment, the number of the first mark trenches 251 is four. The top of each first mark trench 251 may be stripe-shaped. Further, the four first mark trenches 251 may form a quadrangle around the second mark region 260. In one embodiment, the lengths of the four first mark trenches 251 are identical; and the four first mark trenches 251 form a square around the second mark region. Further, the sidewalls of the first mark trenches 251 may be perpendicular to the mask layer 230.

The first mark, the mark opening 261 and the first opening 241 may be formed by etching through the mask layer 230 and etching a portion of the dielectric layer 220 by a first etching process. Specifically, in one embodiment, the second dielectric layer 223 of the dielectric layer 220 may also be etched through; and the top portion of the first dielectric layer 222 may be etched.

The first opening 241 may be formed in the dielectric layer 220 in the device region 240. The first opening 241 may be used to subsequently form a portion of a conductive structure. The bottom of the first opening 241 may be lower than the surface of the dielectric layer 220; and may be higher than the surface of the device layer 210. The first opening 241 may be used to form an electrical interconnect layer. A second opening may be subsequently formed in the bottom of the first opening 241 to expose the conductive layer 211. The second opening may be used to form a conductive via; and the conducive via may be used to electrically interconnect the conductive layer 211 and the electrical interconnect layer. The conductive via and the electrical interconnect layer may form an electrical conductive structure.

When the first opening 241 is formed, the first mark may be formed in the first mark region simultaneously. Thus, the relative position between the first mark and the first opening 241 may be fixed. When a second opening is subsequently formed in the bottom of the first opening 241, a second mark may also be formed simultaneously. Thus, the offset between the first opening and the second opening may he obtained according to the relative position between the first mark and the second mark. Therefore, the fabrication process may be improved according to the offset.

The process for forming the first mark trenches 251, the mark opening 261 and the first opening 241 may include forming a first pattern layer 201 exposing portions of the surface of the mask layer 230 corresponding to the first mark trenches 251, the mark opening 261 and the first opening 241 on the mask layer 230; and etching the mask layer 230 and the portion of the dielectric layer 220 by the first etching process using the first pattern layer 201 has an etching mask. Thus, the first mark trenches 251, the mark opening 261 and the first opening 241 may be formed. After the first etching process, the first pattern layer 201 may be removed.

The first pattern layer 201 may be a patterned photoresist layer. The process for forming the first pattern layer 201 may include forming a first photoresist film on the surface of the mask layer 230 by a spin-coating process; and exposing, developing and baking the photoresist film. Thus photoresist film may be transferred as the first pattern layer 201. In certain other embodiments, the first pattern layer 201 may be formed by a nano-imprint process, or self-assemble process, etc.

The first etching process may be a dry etching process, or a wet etching process. In one embodiment, the first etching process is an anisotropic dry etching process. The etching gases of the dry etching process may include carbon fluoride gas, $O_2$ and a carrier gas, etc. The flow rate of the etching gas may be in a range of approximately 50 sccm-1000 sccm. The pressure of the etching gas may be in a range of approximately 1 mTorr-50 mTorr. The bias voltage of the dry etching process be in a range of approximately 10 V-80 V. The power of the dry etching process may be in a range of approximately 100 W-800 W. The temperature of the dry etching process may be in a range of approximately 40° C.-200° C. The carbon fluoride gas may include one or more of $CF_4$, $C_3F_8$, $C_4F_8$, $CH_2F_2$, $CH_3F$ and $CHF_3$, etc. The carrier gas may include one or more of Ar, He and $N_2$, etc.

During the dry etching process, by the adjusting the ratio between C and F, the selectivity of the etching gas may be adjusted. The adjustment of the ratio between C and F may enable the first etching process to have a relatively high etching selectivity to the mask layer 230 and the dielectric layer 220.

During the first etching process for forming the first opening 241 in the device region 240 and the first mark trenches 251 in the first mark region 250, the mark opening 261 may be formed in the second mark region 260. The second mark region 260 may be used to subsequently form a second mark. The second mark may have a fixed relative position with the second opening subsequently formed in the bottom of the first opening 241. By measuring the overlay precision between the second mark and the first mark, the offset of the second opening to the first opening 241 may be obtained.

Because the subsequent second etching process used for forming the second opening may etch the dielectric layer 220 in the bottom of the first opening 241, the second etching process may have a higher etching rate to the dielectric layer 220 than the etching rate of the first etching process to the dielectric layer 220. The etching rate of the second etching process to the mask layer 230 may be reduced. To ensure the subsequent second etching process to be able to form the second mark in the dielectric layer 220, the mark opening 261 exposing at least a portion of the dielectric layer 220 may be formed in the second mark region 260.

In one embodiment, the bottom of the mark opening 261 may he lower than the surface of the dielectric layer 220 and higher than the surface of the device layer 210. Further, the mark opening 261 may expose a portion of the dielectric layer 220 in the mark region 260. The area of the exposed portion of the dielectric layer 220 may be greater than the area of the region corresponding to the subsequently formed second mark. Such a geometry may ensure to subsequently form the second mark in the dielectric layer 220 in the bottom of the mark opening 261. In certain other embodiments, the mark opening 261 may expose the entire portion of the dielectric layer 220 in the second mark region 260.

In one embodiment, the top of the mark opening 216 is a square and the length of each side of the square may be in a range of approximately 0.02 μm-0.03 μm. For example, the length of the side of the square may be approximately 0.025 μm.

Figure 8:
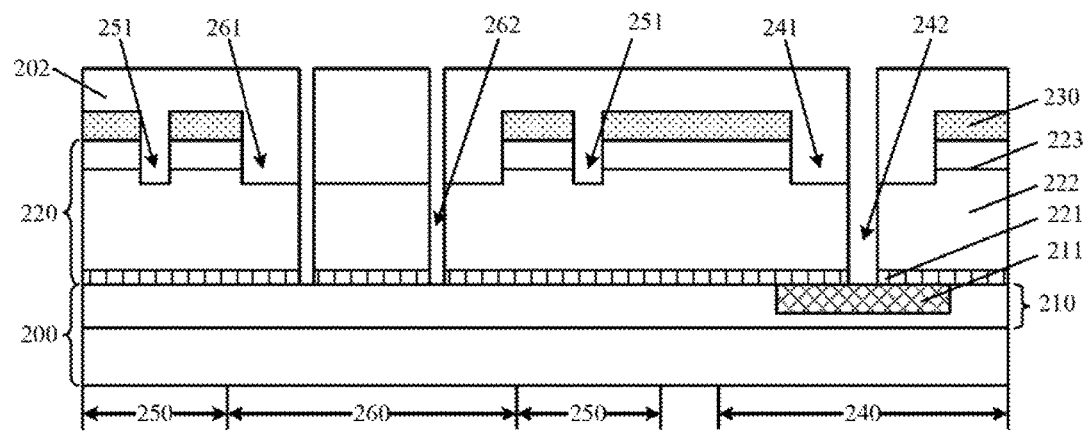
Figure 9:
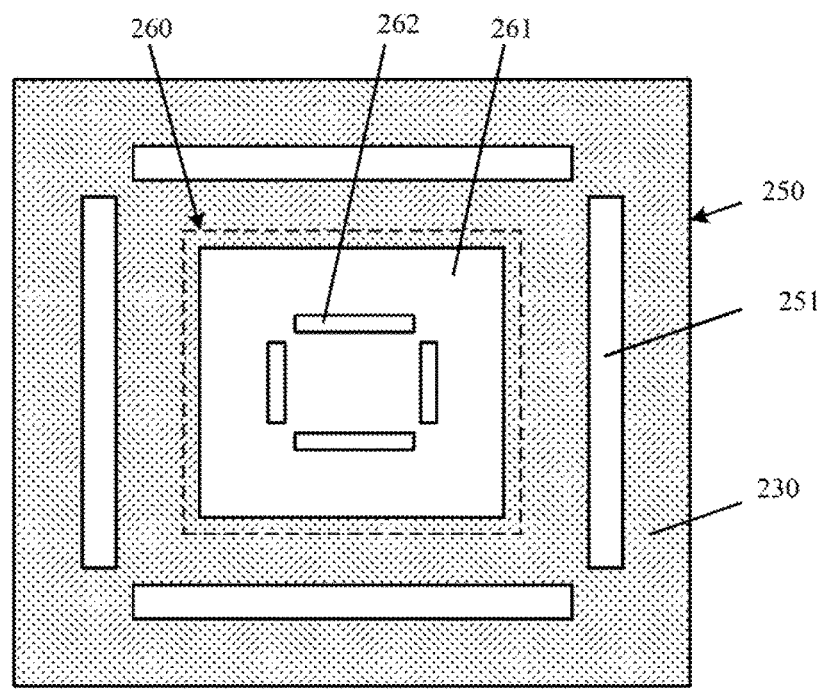

Returning to FIG. 15. after forming the first mark, the first mark opening 261 and the first opening 241, a second mark and a second opening may be formed (S103). FIGS. 8-9 illustrate a corresponding structure; and FIG. 9 is a top view of the mark region illustrated in FIG. 8.

As shown in FIGS. 8-9, a second opening 242 exposing the device layer 210 is formed in the dielectric layer 220 on the bottom of the first opening 241. Further, a second mark (not labeled) is formed in the dielectric layer 220 on the bottom of the mark opening 261.

The second mark may include a plurality of second mark trenches 262. The plurality of second mark trenches 262 may be uniformly distributed around the central point of the second mark region 260.

In one embodiment, the number of the second mark trenches 262 is four. The top of each of the second mark trenches 262 may be stripe-shaped; and the four second mark trenches 262 may be distributed as a quadrangle around the central point of the second mark region 260.

In one embodiment, the lengths of the tops of the four second mark trenches 262 are identical. Thus, the second mark trenches 262 may form a square. Further, the side surfaces of the second mark trenches 262 may be perpendicular to the surface of the device layer 210.

The second opening 242 may be used to subsequently form a portion of a conductive structure. Specifically, the second opening 242 may be used to form a conductive via. The conductive via may be used to electrically connect the electrical interconnect layer subsequently formed in the first opening 241 with the conductive layer 211.

During the process for forming the second opening 242, the second mark may be formed in the dielectric layer 220 on the bottom of the mark opening 261 simultaneously. The second mark and the second opening 242 may have a fixed relative position. The offset of the second opening 242 relative to the first opening 241 may be obtained according to the overlay mark measurement between the first mark and the second mark.

The second mark and the second opening 242 may be formed by etching portions of the dielectric layer 220 on the bottom of the first opening 241 and on the bottom of the mark opening 261 using a second etching process. Specifically, the process for forming the plurality of second mark trenches 262 and the second opening 242 may include forming a second pattern layer 202 exposing portions of the surface of the dielectric layer 220 corresponding to the second mark trenches 262 and the second opening 242 on the surface of the mask layer 230 and a portion of the dielectric layer 220; and etching the portions of the dielectric layer 220 by the second etching process using the second pattern layer 202 as an etching mask. Thus, the second mark trenches 262 and the second opening 242 may be formed. After forming the second mark trenches 262 and the second opening 242, the second pattern layer 202 may be removed.

In one embodiment, the second pattern layer 202 may be a patterned photoresist layer. Before forming the patterned photoresist layer, an antireflective layer may be formed on the surface of the mask layer 230 and the dielectric layer 220; and the photoresist layer may be formed on the surface of the antireflective layer.

The process for forming the patterned photoresist layer may include forming a second photoresist layer on the surfaces of the mask layer 230 and the dielectric layer 220 by a spin-coating process; and exposing, developing and baking the photoresist layer. Thus, the second photoresist layer may be patterned. In certain other embodiments, the second pattern layer 202 may be formed by a nano-imprinting process, or a self-assembly process, etc.

The second etching process may be a dry etching process, or a wet etching process. In one embodiment, the second etching process is an anisotropic dry etching process. The anisotropic dry etching process may be performed until the surface of the conductive layer 211 is exposed.

The etching gas of the anisotropic dry etching process may include carbon fluoride gas, $O_2$ and carrier gas, etc. The flow rate of the etching gas may be in a range of approximately 50 sccm-1000 sccm. The pressure of the etching gas may be in a range of approximately 1 mTorr-50 mTorr. The bias voltage of the anisotropic dry etching process may be in a range of approximately 10 V-800 V. The power of the anisotropic dry etching process may be in a range of approximately 100 W-800 W. The temperature of the anisotropic dry etching process may be in a range of approximately 40° C.-200° C. The carbon fluoride gas may include one or more of $CF_4$, $C_3F_8$, $C_4F_8$, $CH_2F_2$, $CH_3F$ and $CF_3$, etc. The carrier gas may include one or more of Ar, He, and $N_2$, etc.

By adjusting the ratio between carbon and fluoride in the carbon fluoride gas, the etching selectivity of the etching gas may be adjusted. Because the second etching process may be used to etch the dielectric layer 220 until the surface of the conductive layer 211 is exposed, the etching depth in the dielectric layer caused by the second etching process may be relatively large. Thus, the ratio between carbon and fluoride in the etching gas may need to be adjusted to increase the etching rate of the second etching process to the dielectric layer 220 and to reduce the etching rate of the second etching process to the mask layer 230. That is, the etching rate of the second etching process to the mask layer 230 may be smaller than the etching rate of the first etching process to the mask layer 230.

Because the second mark trenches 262 and the second opening 242 may have a fixed relative distance, by measuring the overlay precision between the second mark trenches 262 and the first mark trenches 251, the offset of the second opening 242 relative to the first opening 241 may be obtained. According to such an offset, the fabrication process may be improved.

After forming the second mark, an overlay mark measurement may be performed to determine the offset of the second opening 242 relative to the first opening 241. If the offset meet the design requirement, a conductive structure may be formed in the first opening 241 and the second opening 242.

The process for forming the conductive structure may include forming a conductive material film on the surface of the mask layer 230 and in the first opening 241 and the second opening 242. The conductive material film may fill the first opening 241 and the second opening 242. After forming the conductive material film, a planarization process may be performed until the surface of the dielectric layer 220 is exposed.

The planarization process may be a chemical mechanical polishing process. After removing the conductive material film higher than the surface of the mask layer 230, the chemical mechanical polishing process may continue until the surface of the dielectric layer 220 is exposed.

In one embodiment, the bottoms of the first mark trenches 251 and the bottoms of the second mark trenches 262 may be both lower than the surface of the dielectric layer 220. Thus, after the planarization process, the first mark trenches 251 and the second mark trenches 262 may still exist; and may be still clear. Accordingly, the overlay precision measurement may be accurate.

In one embodiment, before forming the conductive material film, a third pattern layer (not shown) may be formed on the surface of the mask layer 230, the mark opening 216, the first mark trenches 251 and the second mark trenches 262 in the mark region. The third pattern layer may expose the device region 240. The third pattern layer may be made of a transparent material.

In one embodiment, the conductive structure may be made of Cu; and an electro-chemical plating (ECP) process may be used to form the conductive structure. The process for forming the conductive material film may include forming a seed layer on the surface of the mask layer 230, and the inner side surfaces of the first opening 241 and the second opening 242; and forming the conductive material film by the ECP process until the first opening 241 and the second opening 242 are filled.

The seed layer may be made of a conductive material. The conductive material may be one or more of Cu, W, Al, Ag, Ti, Ta, TiN, and TaN, etc. The seed layer may be used as a conductive layer for the ECP process. Further, the seed layer may also be used as a barrier layer between the conductive structure and the dielectric layer 220 to prevent the metal atoms in the conductive structure from diffusing into the dielectric layer 220. Various processes may be used to form the seed layer, such as a CVD process, a PVD process, or an ALD process, etc.

Thus, a mark structure may be formed by the disclosed methods and processes. FIGS. 8-9 illustrate a corresponding mark structure.

As shown FIGS. 8-9, the mark structure includes a substrate 200 having a device region 240 and a mark region (not labeled). The mark region may include a first mark region 250 and a second mark region 260 surrounded by the first mark region 250. The mark structure may also include a conductive layer 211 formed in the surface of the substrate 200 in the device region 240; and a dielectric layer 220 formed on the surface of the substrate 200 and the surface of the conductive layer 211. Further, the mark structure may also include a plurality of first mark trenches 251 formed in the dielectric layer 220 in the first mark region 250; and a mark opening 261 and a plurality of second mark trenches 262 formed in the dielectric layer 220 in the second mark region 260. Further, the mark structure may also include a conducive structure (not shown) formed in a first opening 241 and a second opening 242 in the dielectric layer 220 in the device region 240. The detailed structures and intermediate structures are described above with respect to the fabrication processes.

Figure 10:
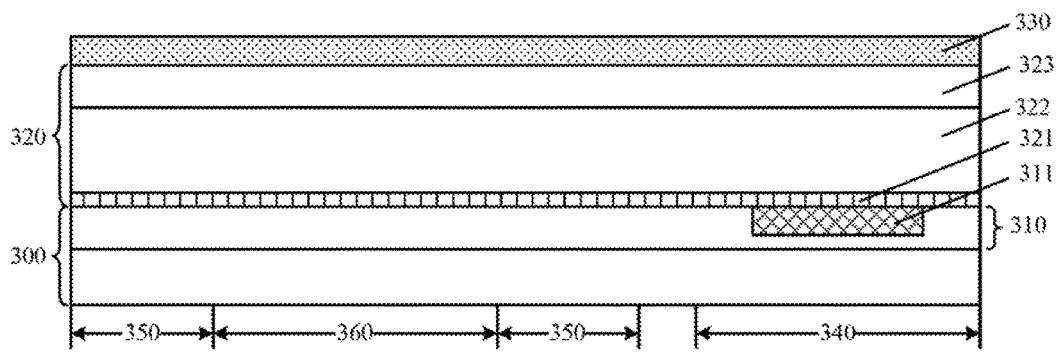

FIGS. 10-14 illustrate structures corresponding to certain stages of another exemplary fabrication process of a mark structure consistent with the disclosed embodiments. As shown in FIG. 10, at the beginning of the fabrication process, a substrate 300 is provided. The substrate 300 may include a mark region (not labeled) and a device region 340. The mark region may include a first mark region 350 and a second mark region 360. The first mark region 350 may surround the second mark region 360.

The substrate 300 may include a device layer 310; and a conductive layer 311 may be formed in the surface of the device layer 310 in the device region 340. Further, a dielectric layer 320 may be formed on the surface of the device layer 310 and the conductive layer 311. The dielectric layer 320 may include a barrier layer 311 formed on the surface of the device layer 310 and the surface of the conducive layer 311, a first dielectric layer 322 formed on the barrier layer 311 and a second dielectric layer 323 formed on first dielectric layer 322. Further, a mask layer 330 may be formed on the dielectric layer 320. The detailed information of the substrate 300, the dielectric layer 320 and the mask layer 330 may refer to the previous description of the structure illustrated in FIG. 5.

Figure 11:
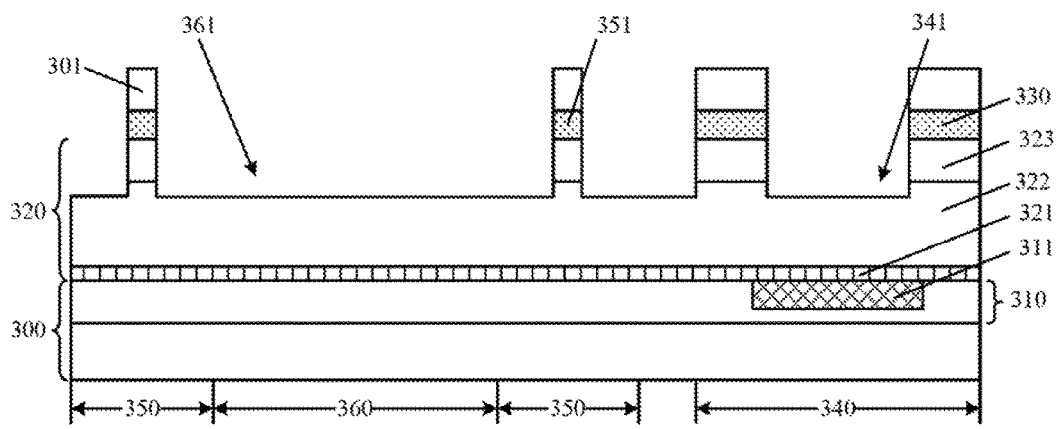
Figure 12:
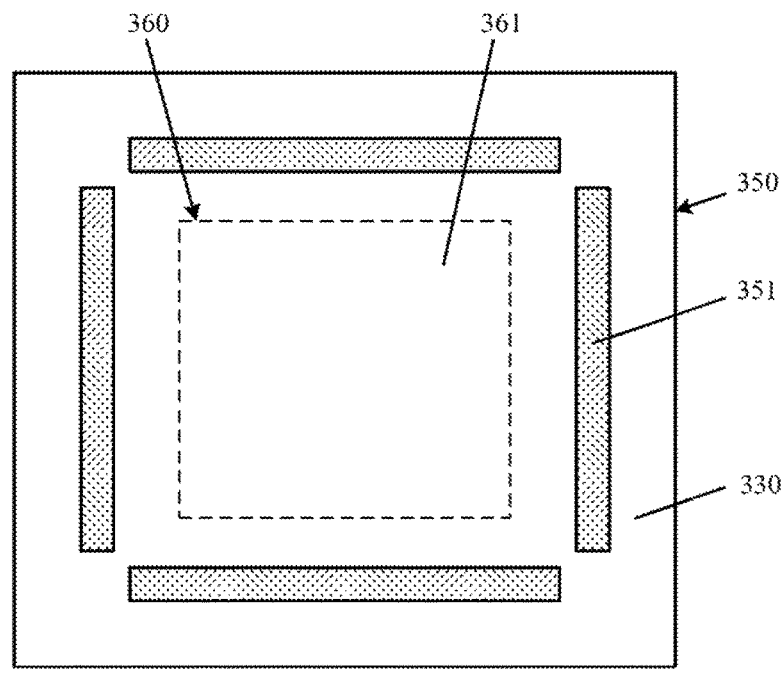

Further, as shown in FIGS. 11-12 (FIG. 12 is a top view of the mark region illustrated in FIG. 11), after forming the mask layer 330, a first etching process may be used etch portions of the mask layer 220 and the dielectric layer 320 to form a first opening 341 in the device region 340, a first mark (not labeled) in the first mark region 350 and a mark opening 361 in the second mark region 360. The bottom of the first opening 341 and the bottom of the mark opening 361 may be higher than the surface of the device layer 310. Further, the mark opening 361 may expose at least a portion of the dielectric layer 320 in the second mark region 360.

The first mark may include a plurality of first mark protruding parts 351. The plurality of first mark protruding parts 351 may be uniformly distributed around the second mark region 360.

In one embodiment, the number of the first mark protruding parts 351 is four. The top of each first mark protruding part 351 may be stripe-shaped; and the four first mark protruding parts 351 may form a quadrangle. In one embodiment, the lengths of the four first mark protruding parts 351 are identical. Thus, the four first mark protruding parts 351 form a square. Further, the side surfaces of the first mark protruding parts 351 may be perpendicular to the surface of the dielectric layer 320.

The process for forming the first mark protruding parts 351, the mark opening 361 and the first opening 341 may include forming a first pattern layer 301 exposing the surface of the mask layer 330 in the entire second mark region 360 and portions of the surface of the mask layer 330 in the first mark region 350 and the device region 340 and covering the portions of the mask layer 330 corresponding to the first mark protruding parts 351 on surface of the mask layer 330; and etching the mask layer 330 and the portions of the dielectric layer 320 by the first etching process using the first pattern 301 as an etching mask. Thus, the first mark protruding parts 351, the mark opening 361 and the first opening 341 may be formed. After the first etching process, the first pattern layer 301 may be removed.

The first pattern layer 301 may be a patterned photoresist layer. In certain other embodiments, the first pattern layer 301 may be formed by a nano-imprinting process, or a self-assemble process.

In one embodiment, the first etching process may be an anisotropic dry etching process. By adjusting the carbon-to-fluoride ratio of the etching gas of the dry etching process, the etching selectivity of the dry etching process may be adjusted so as to enable the first etching process to have a relatively high etching rate to the mask layer 330 and the dielectric layer 320.

During the first etching process for forming the first opening 341 and the first mark protruding structures 351, the mark opening 361 may be formed simultaneously. The mark opening 361 may be used to subsequently form a second mark.

Figure 13:
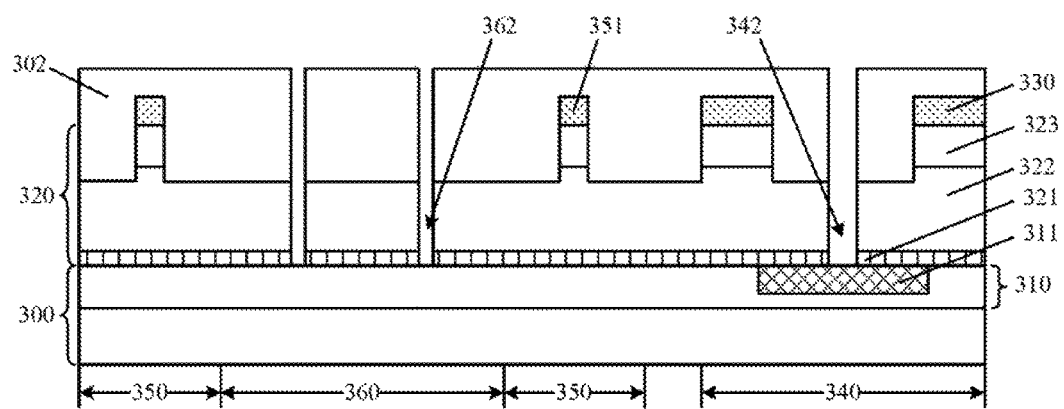

Further, as shown in FIGS. 13-14 (FIG. 14 is a top view of the mark region illustrated in FIG. 13), after forming the first opening 341, the first mark protruding structures 351 and the mark opening 361, a second opening 342 and a second mark (not labeled) may be formed. The second opening 342 may be formed in the dielectric layer 320 on the bottom of the mark opening 361 (as shown in FIG. 11). The second opening 342 may expose the device layer 310.

The second mark may be formed in the dielectric layer 320 on the bottom of the mark opening 361. The second mark may include a plurality of second mark trenches 362. The plurality of second mark trenches 362 may be uniformly distributed around the center of the second mark region 360.

In one embodiment, the number of the second mark trenches 362 is four. The top of each second mark trench 362 may be stripe-shaped; and the four second mark trenches 362 may form a quadrangle. In one embodiment, the lengths of the four second mark trenches 362 are identical. Thus, the four second mark trenches 362 form a square. Further, the side surfaces of the second mark trenches 362 may be perpendicular to the surface of the device layer 310.

The process for forming the second mark trenches 362 and the second opening 342 may include forming a second pattern layer 302 exposing portions of the surface of the dielectric layer 320 corresponding to the second mark trenches 362 and the second opening 342 on the surface of the mask layer 330; and etching the portions of the dielectric layer 320 by a second etching process using the second pattern layer 302 as an etching mask. Thus, the second mark trenches 362 and the second opening 342 may be formed. After the second etching process, the second pattern layer 302 may be removed.

The second pattern layer 302 may be a patterned photoresist layer. In certain other embodiments, the second pattern layer 302 may be formed by a nano-imprinting process, or a self-assemble process.

In one embodiment, the second etching process may be an anisotropic dry etching process. The etching rate of the first etching process to the mask layer 330 may be greater than the etching rate of the second etching process to the mark layer 330.

In one embodiment, after the second etching process, an overlay mark measurement of the first mark and the second mark may be performed. If the offset of the first opening and the second opening matches the designed requirement, a conducive structure may be formed in the first opening 341 and the second opening 342.

Thus, a mark structure may be formed by the disclosed methods and processes. The corresponding mark structure is illustrate in FIGS. 13-14.

As shown FIGS. 13-14, the mark structure includes a substrate 300 having a device region 340 and a mark region (not labeled). The mark region may include a first mark region 350 and a second mark region 360 surrounded by the first mark region 350. The mark structure may also include a conductive layer 311 formed in the surface of the substrate 300 in the device region 340; and a dielectric layer 320 formed on the surface of the substrate 300 and the surface of the conductive layer 311. Further, the mark structure may also include a plurality of first mark protruding structures 351 formed in the dielectric layer 320 in the first mark region 350; and a mark opening 361 and a plurality of second mark trenches 362 formed in the dielectric layer 320 in the second mark region 360. Further, the mark structure may also include a conductive structure (not shown) formed in a first opening 341 and a second opening 342 in the dielectric layer 320 in the device region 340. The detailed structures and intermediate structures are described above with respect to the fabrication processes.

Therefore, according to the disclosed processes and device structures, during etching the mask layer and the dielectric layer by a first etching process, not only a first opening may be formed in the device region, but also a first mark may be formed in the first mark region; and a mark opening may be formed in the second mark region simultaneously. Because the first etching process may be used to etch the mask layer, the etching raw of the first etching process to the mask layer may be relatively high. Thus, the bottom of the first opening may be lower than the surface of the dielectric layer and higher than the surface of the device layer; and the bottom of the mark opening may also be lower than the surface of the dielectric layer and higher than the surface of the device layer. The mark opening may open a process window for subsequently forming a second mark in the second mark region.

Further, because the second etching process may be used to etch the dielectric layer on the bottom of the first opening to expose the surface of the device layer, the etching rate of the second etching process to the dielectric layer may be relative large, but the etching rate of the second etching process to the mask layer may be relatively small. Because the mark opening in the second mark region may also expose a portion of the dielectric layer, the second etching process may be able to etch the dielectric layer in the mark region with an enough depth; and the patterns of the second mark may be clear. Thus, using the first mark and the second mark to perform an overlay mark measurement may be able to accurately obtain the relative offset between the first opening and the second opening. Accordingly, an auxiliary method may be provided to improve the fabrication processes of semiconductor devices.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a mark structure, comprising:
   providing a substrate having a device region and a mark region including a first mark region and a second mark region surrounded by the first mark region;
   sequentially forming a device layer, a dielectric layer and a mask layer on a surface of the substrate;
   forming a first opening in the dielectric layer in the device region, a first mark in the dielectric layer in the first mark region, and a mark opening in dielectric layer in the second mark region, a bottom of the first opening, a bottom of the first mark and a bottom of the mark opening being lower than a surface of the dielectric layer, and higher than a surface of the device layer;
   forming a second opening exposing the device layer in the dielectric layer on the bottom of the first opening and a second mark in the dielectric layer on the bottom of the mark opening; and
   forming a conductive structure in the first opening and the second opening.

2. The method according to claim 1, wherein:
   the first mark includes a plurality of first mark trenches.

3. The method according to claim 2, wherein forming the first mark, the first opening, and the first mark opening comprises:
   forming a first pattern layer exposing portions of a surface of the mask layer corresponding to the first trench marks, the first opening, and the mark opening on the surface of the mask layer;

etching the mask aver and portions of the dielectric layer by a first etching process using the first pattern layer as an etching mask; and removing the first pattern layer.

4. The method according to claim 2, wherein:

the first mark includes a plurality of first mark protruding parts.

5. The method according to claim 4 wherein forming the mark, the first opening, and the first mark opening comprises:

forming a first pattern layer exposing an entire portion of a surface of the mask layer in the second mark region and portions of the surface of the mask layer in the device region and the first mark region, and covering a portion of the surface of the mask layer corresponding to the first mask protruding parts on the surface of the mask layer;

etching the mask layer and portions of the dielectric layer by a first etching process using the first pattern layer as an etching mask; and removing the first pattern layer.

6. The method according to claim 1, wherein:

the second mark includes a plurality of second mark trenches.

7. The method according to claim 6, wherein forming the second mark and the second opening further comprises:

forming a second pattern layer exposing portions of a surface of the dielectric layer corresponding to the second mark trenches and the second opening on the mask layer;

etching the dielectric layer by a second etching process using the second pattern layer as an etching mask; and removing the second pattern layer.

8. The method according to claim 7, wherein:

an etching rate of the first etching process to the mask layer is greater than an etching rate of the second etching process to the mask layer.

* * * * *